(12) United States Patent
Matsuura

(10) Patent No.: US 9,129,864 B2
(45) Date of Patent: Sep. 8, 2015

(54) SEMICONDUCTOR DEVICE

(71) Applicant: Japan Display Inc., Minato-ku (JP)

(72) Inventor: Yuki Matsuura, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/168,366

(22) Filed: Jan. 30, 2014

(65) Prior Publication Data

US 2014/0231797 A1   Aug. 21, 2014

(30) Foreign Application Priority Data

Feb. 20, 2013 (JP) .................................. 2013-030931

(51) Int. Cl.
*H01L 29/78* (2006.01)
*H01L 27/12* (2006.01)

(52) U.S. Cl.
CPC .......... *H01L 27/1225* (2013.01); *H01L 27/124* (2013.01); *H01L 27/1255* (2013.01)

(58) Field of Classification Search
CPC .................................................. H01L 29/7869
USPC .......................................................... 257/43
See application file for complete search history.

(56) References Cited

U.S. PATENT DOCUMENTS

| | | | |
|---|---|---|---|
| 6,262,438 B1 | 7/2001 | Yamazaki et al. | |
| 6,570,631 B2 * | 5/2003 | Ko | 349/43 |
| 2001/0041414 A1 | 11/2001 | Yamazaki et al. | |
| 2007/0103610 A1 * | 5/2007 | Lee et al. | 349/38 |
| 2009/0141203 A1 * | 6/2009 | Son et al. | 349/39 |

FOREIGN PATENT DOCUMENTS

| | | |
|---|---|---|
| JP | 9-325364 | 12/1997 |
| JP | 10-133233 | 5/1998 |
| JP | 2010-135777 | 6/2010 |

* cited by examiner

*Primary Examiner* — Tran Tran
(74) *Attorney, Agent, or Firm* — Oblon, McClelland, Maier & Neustadt, L.L.P.

(57) ABSTRACT

According to one embodiment, a semiconductor device includes, an oxide semiconductor layer including a channel region, and a source region and a drain region, a first insulation film covering the channel region and exposing the source region and the drain region, a first conductive layer including a gate electrode, and a first terminal electrode, a second insulation film covering the first conductive layer, the source region and the drain region, a second conductive layer including a source electrode, a drain electrode, and a second terminal electrode which is opposed to the first terminal electrode via the second insulation film, and a third insulation film interposed between the second insulation film, and the source electrode and the drain electrode.

4 Claims, 8 Drawing Sheets

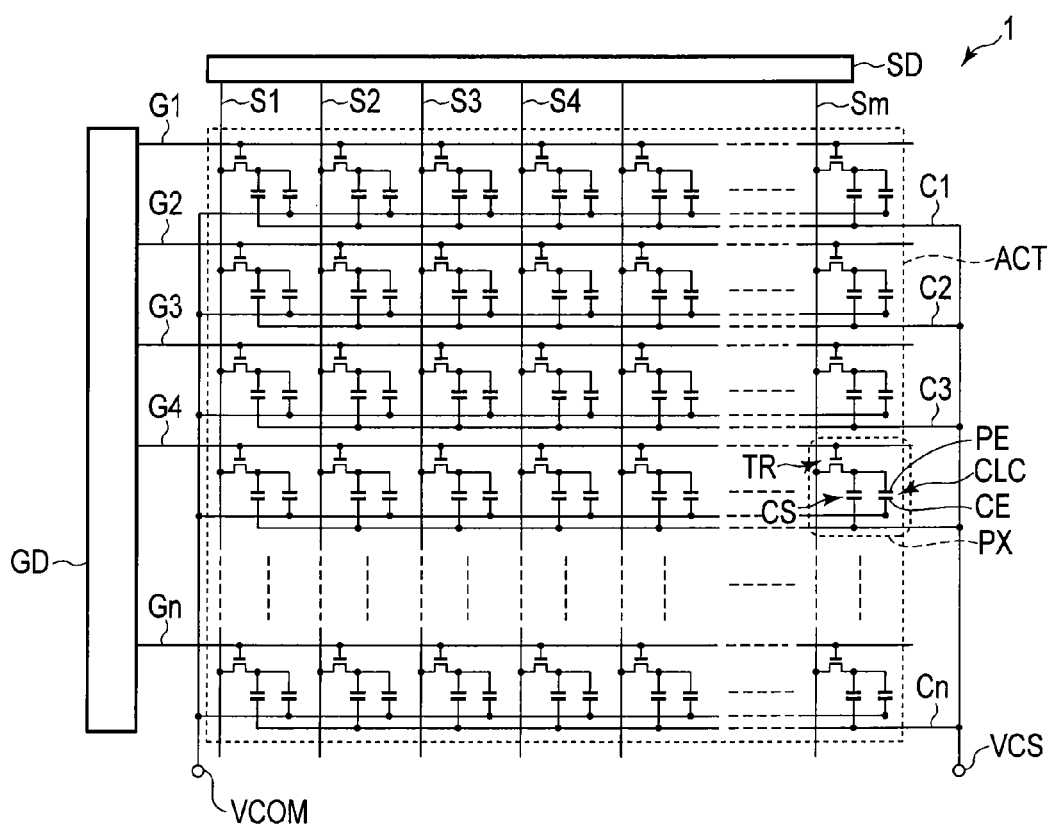
F I G. 1

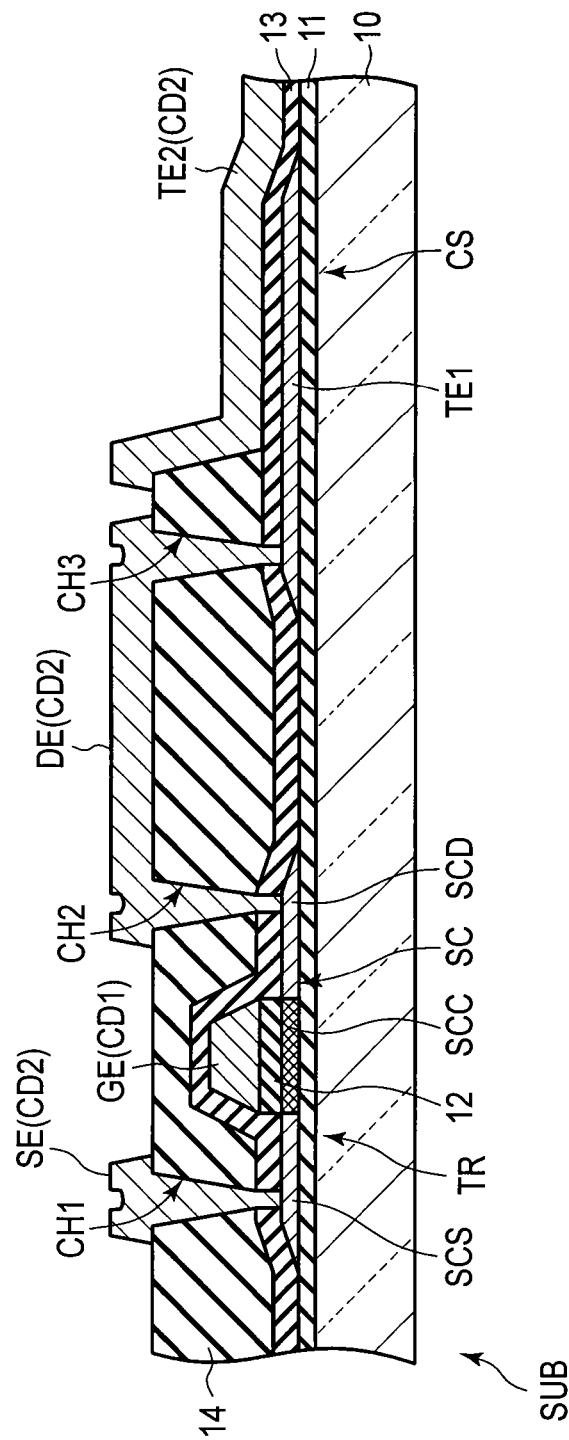
F I G. 5

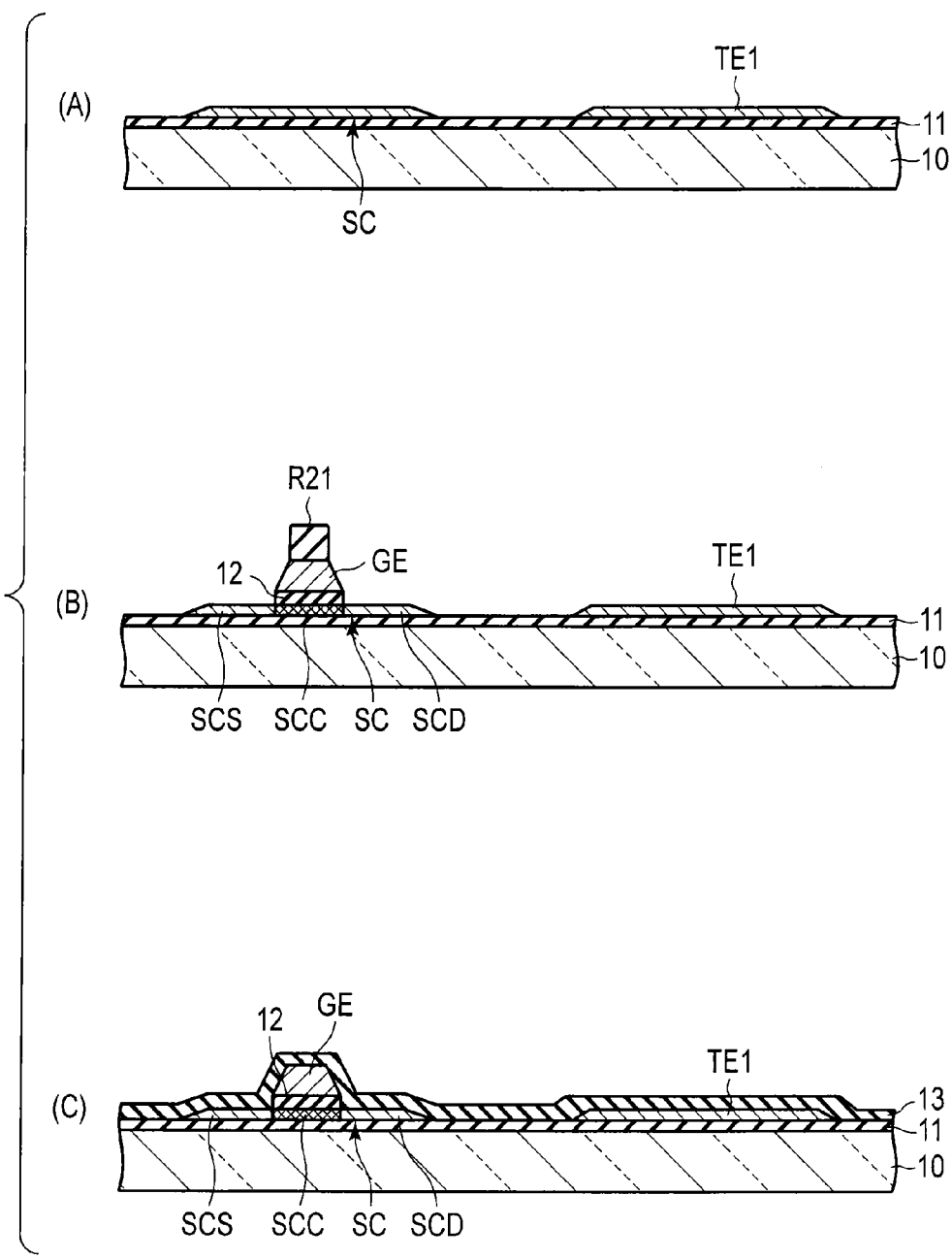
F I G. 6

US 9,129,864 B2

SEMICONDUCTOR DEVICE

CROSS-REFERENCE TO RELATED APPLICATIONS

This application is based upon and claims the benefit of priority from Japanese Patent Application No. 2013-030931, filed Feb. 20, 2013, the entire contents of which are incorporated herein by reference.

FIELD

Embodiments described herein relate generally to a semiconductor device.

BACKGROUND

In recent years, display devices including thin-film transistors and capacitors have been put to practical use. Examples of the display devices are a liquid crystal display device and an organic electroluminescence display device.

As an example of the structure of the thin-film transistor, there is known a top gate structure including a polysilicon semiconductor layer. In addition, a structure in which a capacitor is formed by using a polysilicon semiconductor layer is known. Besides, there is known a structure in which a capacitor is formed by using a Cs line which is in the same layer as a gate line, and a drain electrode which is opposed to the Cs line via a gate insulation film.

Recently, as a structure of a thin-film transistor, a structure including a layer of an oxide semiconductor typified by indium gallium zinc oxide (IGZO) has been vigorously studied. The oxide semiconductor, compared to polysilicon, enables uniform formation over a wide area at relatively low temperatures. In addition, in the fabrication step of forming an oxide semiconductor, it is not necessary to perform a step of crystallization by a laser anneal method which is required when a low-temperature polysilicon semiconductor is formed, or a step of decreasing the resistance of a diffusion region by an ion implantation method, or a step of activation anneal which is required when the resistance of a diffusion region is to be decreased. Thus, the step of forming the oxide semiconductor can lower the manufacturing cost, and does not require a high-temperature process. A bottom gate structure is dominant in thin-film transistors including oxide semiconductor layers.

Drawbacks in adopting the bottom-gate-type thin-film transistor are the difficult in enhancing the capability or fineness by decreasing the channel length, and the increase in gate-source parasitic capacitance of the thin-film transistor. This leads to a problem of degradation in display capability. In order to solve these problems, there has been a demand for practical use of a top-gate-type thin-film transistor including an oxide semiconductor layer.

BRIEF DESCRIPTION OF THE DRAWINGS

FIG. 1 is a view which schematically illustrates a structure example of a display device to which a semiconductor device according to an embodiment is applicable.

FIG. 5 is a cross-sectional view which schematically illustrates another structure example of the array substrate which is applicable to the display device shown in FIG. 1.

FIG. 6 is a view for describing a manufacturing method of the array substrate shown in FIG. 5.

DETAILED DESCRIPTION

Figure 2:
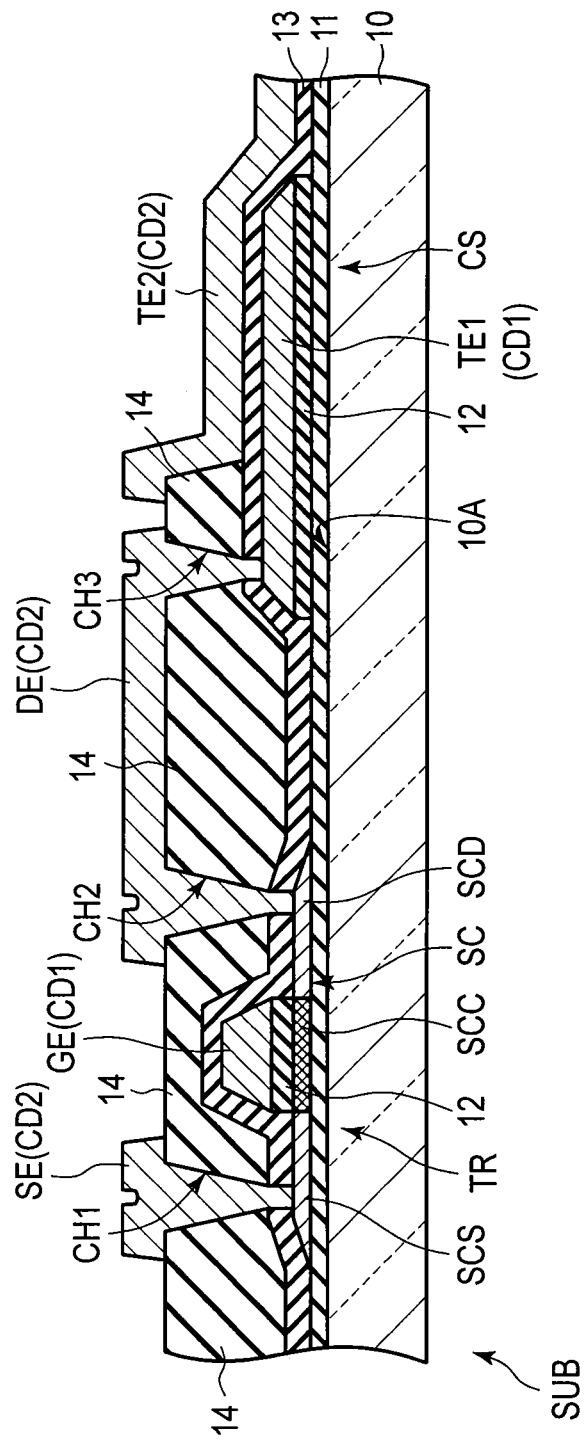
FIG. 2 is a cross-sectional view which schematically illustrates a structure example of an array substrate which is applicable to the display device shown in FIG. 1.

In general, according to one embodiment, a semiconductor device includes: an insulative substrate; an oxide semiconductor layer located above the insulative substrate and including a channel region, and a source region and a drain region which are located on both sides of the channel region; a first insulation film covering the channel region and exposing the source region and the drain region; a first conductive layer including a gate electrode located on the first insulation film, and a first terminal electrode located above the insulative substrate and spaced apart from the gate electrode; a second insulation film covering the first conductive layer, the source region and the drain region; a second conductive layer including a source electrode which is put in contact with the source region, a drain electrode which is put in contact with the drain region, and a second terminal electrode which is opposed to the first terminal electrode via the second insulation film; and a third insulation film interposed between the second insulation film, and the source electrode and the drain electrode.

According to another embodiment, a semiconductor device includes: an insulative substrate; an oxide semiconductor layer located above the insulative substrate and including a channel region, and a source region and a drain region which are located on both sides of the channel region; a first terminal electrode located above the insulative substrate and formed of the same material as the oxide semiconductor layer; a first insulation film covering the channel region and exposing the source region and the drain region; a first conductive layer including a gate electrode located on the first insulation film; a second insulation film covering the first conductive layer, the first terminal electrode, the source region and the drain region; a second conductive layer including a source electrode which is put in contact with the source region, a drain electrode which is put in contact with the drain region, and a second terminal electrode which is opposed to the first terminal electrode via the second insulation film; and a third insulation film interposed between the second insulation film, and the source electrode and the drain electrode.

Embodiments will now be described in detail with reference to the accompanying drawings. In the drawings, structural elements having the same or similar functions are denoted by like reference numerals, and an overlapping description is omitted.

FIG. 1 is a view which schematically illustrates a structure example of a display device to which a semiconductor device according to an embodiment is applicable. In this example, a liquid crystal display device is described as the display device.

Specifically, a liquid crystal display device includes a display section (active area) ACT which displays an image. The display section ACT is composed of a plurality of pixels PX which are arrayed in a matrix.

In the display section ACT, gate lines G (G1 to Gn), capacitance lines C (C1 to Cn) and source lines S (S1 to Sm) are formed. Each of the gate lines G is led out of the display section ACT and is connected to a gate driver GD. Each of the source lines S is led out of the display section ACT and is connected to a source driver SD. The capacitance line C is electrically connected to a voltage application module VCS to which a storage capacitance voltage is applied.

Each pixel PX is composed of a liquid crystal capacitor CLC, a thin-film transistor (TFT) TR, and a capacitor (also referred to as "auxiliary capacitance" or "storage capacitance") which is parallel to the liquid crystal capacitor CLC. The liquid crystal capacitor CLC is composed of a pixel electrode PE which is connected to the thin-film transistor TR, a common electrode CE which is electrically connected to a power supply module VCOM of a common potential, and a liquid crystal layer which is interposed between the pixel electrode PE and the common electrode CE.

The thin-film transistor TR is electrically connected to the gate line G and source line S. A control signal for ON/OFF controlling the thin-film transistor TR is supplied to the gate line G. A video signal is supplied to the source line S. When the thin-film transistor TR is turned on by the control signal supplied to the gate line G, the thin-film transistor TR writes in the pixel electrode PE a pixel potential which corresponds to the video signal supplied to the source line S. A voltage, which is applied to the liquid crystal layer, is controlled by a potential difference between the common electrode CE of the common potential and the pixel electrode PE of the pixel potential.

The capacitor CS holds the voltage, which is applied to the liquid crystal layer, for a fixed period, and is composed of a pair of electrodes which are opposed via an insulation film. For example, the capacitor CS is composed of a first terminal electrode having the same potential as the pixel electrode PE, a second terminal electrode which is a part of the capacitance line C or is electrically connected to the capacitance line C, and an insulation film interposed between the first terminal electrode and the second terminal electrode.

Figure 8:
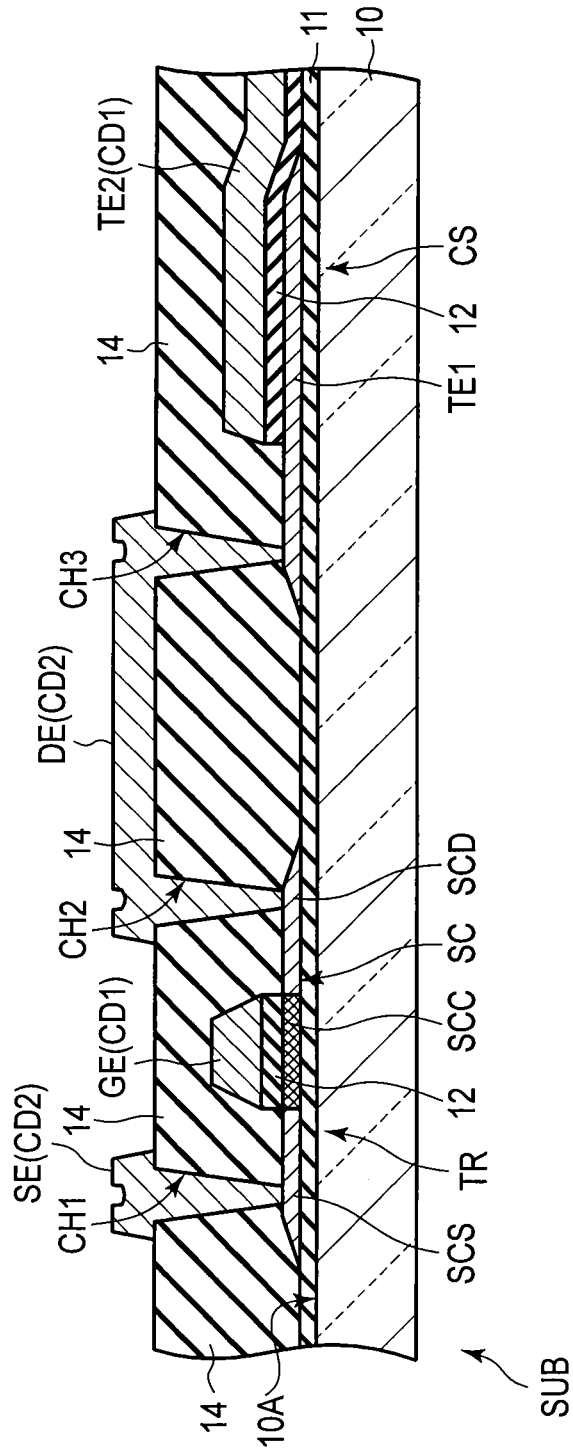
FIG. 8 is a cross-sectional view which schematically illustrates an example of an array substrate which is applicable to the display device shown in FIG. 1.

FIG. 8 is a cross-sectional view which schematically illustrates an example of an array substrate which is applicable to the display device shown in FIG. 1.

Specifically, an array substrate SUB is formed by using an insulative substrate 10. The array substrate SUB includes a thin-film transistor TR and a capacitor CS on the insulative substrate 10. The thin-film transistor TR and capacitor CS include a first conductive layer CD1, a second conductive layer CD2, an oxide semiconductor layer SC, and a gate insulation film (first insulation film) 12. In the example illustrated, an inner surface 10A of the insulative substrate 10 is covered with an undercoat layer 11 which is an insulation film.

The oxide semiconductor layer SC, which constitutes the thin-film transistor TR, is located above the insulative substrate 10. In the example illustrated, the oxide semiconductor layer SC is formed on the undercoat layer 11. The oxide semiconductor layer SC includes a channel region SCC, and a source region SCS and a drain region SCD, which are located on both sides of the channel region SCC. The capacitor CS is composed of a first terminal electrode TE1, a second terminal electrode TE2, and a gate insulation film (first insulation film) 12 which is interposed between the first terminal electrode TE1 and second terminal electrode TE2. The first terminal electrode TE1 is formed of the same material as the oxide semiconductor layer SC. The oxide semiconductor layer SC and first terminal electrode TE1 are formed of an oxide including at least one of indium (In), gallium (Ga), zinc (Zn), and tin (Sn).

The channel region SCC is covered with the gate insulation film (first insulation film) 12. The gate insulation film 12 exposes the source region SCS and drain region SCD. The first terminal electrode TE1 is spaced apart from the oxide semiconductor layer SC, and is formed in an island shape.

The first conductive layer CD1 includes a gate electrode GE which constitutes the thin-film transistor TR, and the second terminal electrode TE2 which constitutes the capacitor CS. The gate electrode GE is located on the gate insulation film 12 having an island shape. The second terminal electrode TE2 is spaced apart from the gate electrode GE.

The resistance of the source region SCS and drain region SCD of the thin-film transistor TR is decreased by a resistance-decreasing process, such as a reducing process, which is performed after the gate insulation film (first insulation film) 12 is formed. In the resistance-decreasing process, the channel region SCC is masked by the gate insulation film 12, while the resistance of only the source region SCS and drain region SCD is decreased. At this time, in the capacitor CS, since the second terminal electrode TE2 and gate insulation film (first insulation film) 12 are formed on that part of the first terminal electrode TE1, which is opposed to the second terminal electrode TE2, it is difficult to decrease the resistance of this part of the first terminal electrode TE1 at the same time in the above-described resistance-decreasing process. Thus, there is a concern that the capacitor CS, which is formed in the array substrate shown in FIG. 8, fails to have such a sufficient characteristic that the capacitance varies in accordance with the applied voltage.

FIG. 2 is a cross-sectional view which schematically illustrates a structure example of an array substrate which is applicable to the display device shown in FIG. 1.

Specifically, an array substrate SUB is formed by using an insulative substrate 10 such as a glass substrate or a resin substrate. The array substrate SUB includes a thin-film transistor TR and a capacitor CS on the insulative substrate 10. The thin-film transistor TR and capacitor CS include a first conductive layer CD1 and a second conductive layer CD2.

In the example illustrated, an inner surface 10A of the insulative substrate 10 is covered with an undercoat layer 11 which is an insulation film. The undercoat layer 11 is formed of, for example, silicon oxide (SiO) or silicon oxynitride (SiON). Incidentally, the undercoat layer 11 may be omitted.

An oxide semiconductor layer SC, which constitutes the thin-film transistor TR, is located above the insulative substrate 10. In the example illustrated, the oxide semiconductor layer SC is formed on the undercoat layer 11. The oxide semiconductor layer SC includes a channel region SCC, and a source region SCS and a drain region SCD, which are located on both sides of the channel region SCC. The resistance of the source region SCS and drain region SCD is made lower than the resistance of the channel region SCC. The oxide semiconductor layer SC is formed of an oxide including at least one of indium (In), gallium (Ga), zinc (Zn), and tin (Sn). Typical examples of the material for forming the oxide semiconductor layer SC include indium gallium zinc oxide (IGZO), indium gallium oxide (IGO), indium zinc oxide (IZO), zinc tin oxide (ZnSnO), and zinc oxide (ZnO). Compared to a semiconductor layer formed of amorphous silicon, this oxide semiconductor layer SC has such feature that a high mobility can be realized. In addition, compared to a semiconductor layer formed of polysilicon, this oxide semiconductor layer SC has such feature that the oxide semiconductor layer SC can be uniformly formed over a large area at low temperatures.

The channel region SCC is covered with a gate insulation film (first insulation film) 12. The gate insulation film 12 exposes the source region SCS and drain region SCD. In addition, the gate insulation film 12 is also formed in an island shape in the region where the capacitor CS is formed.

The first conductive layer CD1 includes a gate electrode GE which constitutes the thin-film transistor TR, and a first terminal electrode TE1 which constitutes the capacitor CS. The gate electrode GE is located on the gate insulation film 12 having an island shape. Specifically, the channel region SCC and gate electrode GE are opposed to each other via the gate insulation film 12. The gate electrode GE is electrically connected to a gate line (not shown). The first terminal electrode TE1 is spaced apart from the gate electrode GE and is located above the insulative substrate 10. In the example illustrated, the first terminal electrode TE1 is located on the gate insulation film 12 having an island shape. The first terminal electrode TE1 is formed, for example, in an island shape. Incidentally, the gate insulation film 12, which is interposed between the first terminal electrode TE1 and the undercoat layer 11, may be omitted.

The first conductive layer CD1, which includes the gate electrode GE and first terminal electrode TE1, is formed, for example, in the same fabrication step by using the same wiring material. For example, the first conductive layer CD1 is formed of a metallic material such as molybdenum, tungsten, aluminum, titanium or copper, or an alloy including such metallic material.

The first conductive layer CD1 (including the gate electrode GE and first terminal electrode TE1) and the source region SCS and drain region SCD of the oxide semiconductor SC are covered with a first interlayer insulation film 13 (second insulation film). In addition, the first interlayer insulation film 13 covers the side surface of the island-shaped gate insulation film 12 and the surface of the undercoat layer 11. The first interlayer insulation film 13 is formed of a nonphotosensitive insulative material. As the material for forming the first interlayer insulation film 13, a nonphotosensitive insulative material including silicon oxide as a main component, such as silicon oxide (SiO) or silicon oxynitride (SiON), is suitable. The first interlayer insulation film 13 is formed under such a condition that the hydrogen content in the film decreases. On the other hand, silicon nitride (SiN) is not suitable as the material for forming the first interlayer insulation film 13. The reason is as follows. In the process of forming the first interlayer insulation film 13 which is formed of silicon nitride, since a gas containing hydrogen is used, hydrogen is taken in the first interlayer insulation film 13. Thus, the hydrogen diffuses from the first interlayer insulation film 13 into the oxide semiconductor layer SC, and the hydrogen is combined with the oxygen in the channel region SCC, causing a decrease in resistance of the channel region SCC. Hence, there is a concern that the operation of the thin-film transistor TR becomes unstable. In other words, by applying the first interlayer insulation film 13 which is formed of silicon oxide, it becomes possible to suppress a decrease in resistance of the channel region SCC even if the channel length is decreased.

The first interlayer insulation film 13 is covered with a second interlayer insulation film (third insulation film) 14. The second interlayer insulation film 14 does not cover the entirety of the first interlayer insulation film 13, but exposes a part of that region of the first interlayer insulation film 13, which is located above the first terminal electrode TE1. The second interlayer insulation film 14 is formed, for example, by coating a photosensitive insulative material and then patterning the photosensitive insulative material by a photolithography process. Examples of the material for forming the second interlayer insulation film 14 include olefin resin, acrylic resin, and siloxane resin. In particular, a photosensitive insulative material including olefin resin is suitable. By applying the photosensitive insulative material including olefin resin as the second interlayer insulation film 14, it become possible to improve the waterproof property of, in particular, the oxide semiconductor layer SC and gate electrode GE of the thin-film transistor TR, and to improve the reliability of the thin-film transistor TR.

The second conductive layer CD2 includes a source electrode SE and a drain electrode DE which constitute the thin-film transistor TR, and a second terminal electrode TE2 which constitutes the capacitor CS. The source electrode SE and drain electrode DE are formed on the second interlayer insulation film 14. The source electrode SE is electrically connected to a source line (not shown), and is put in contact with the source region SCS via a contact hole CH1 which penetrates the first interlayer insulation film 13 and second interlayer insulation film 14. The drain electrode DE is spaced apart from the source electrode SE and is put in contact with the drain region SCD via a contact hole CH2 which penetrates the first interlayer insulation film 13 and second interlayer insulation film 14. In addition, in the example illustrated, the drain electrode DE is put in contact with the first terminal electrode TE1 via a contact hole CH3 which penetrates the first interlayer insulation film 13 and second interlayer insulation film 14. The second terminal electrode TE2 is spaced apart from the source electrode SE and drain electrode DE, and is formed on the first interlayer insulation film 13 that is exposed from the second interlayer insulation film 14. The second terminal electrode TE2 is opposed to the first terminal electrode TE1 via the first interlayer insulation film 13. The second terminal electrode TE2 may be a part of the capacitance line C, or may be electrically connected to the capacitance line C which is formed at a position not shown.

The second conductive layer CD2, which includes the source electrode SE, drain electrode DE and second terminal electrode TE2, is formed, for example, in the same fabrication step by using the same wiring material. Alternatively, the source electrode SE and drain electrode DE may be formed in a layer which is different from the layer of the second terminal electrode TE2. For example, the source electrode SE and drain electrode DE may be disposed on another interlayer insulation film which is disposed on the second terminal electrode TE2. In this case, the source electrode SE and drain electrode DE are put in contact with the oxide semiconductor layer SC and the first terminal electrode TE1, respectively, via contact holes penetrating the first interlayer insulation film 13, the second interlayer insulation film 14 and the another interlayer insulation film. The second conductive layer CD2 can be formed of the same material as the above-described first conductive layer CD1.

In the capacitor CS with the above-described structure, a capacitance can be produced via the first interlayer insulation film 13.

Next, an example of the manufacturing method of the array substrate SUB having the above-described structure will be described with reference to FIG. 3 and FIG. 4.

Figure 3:
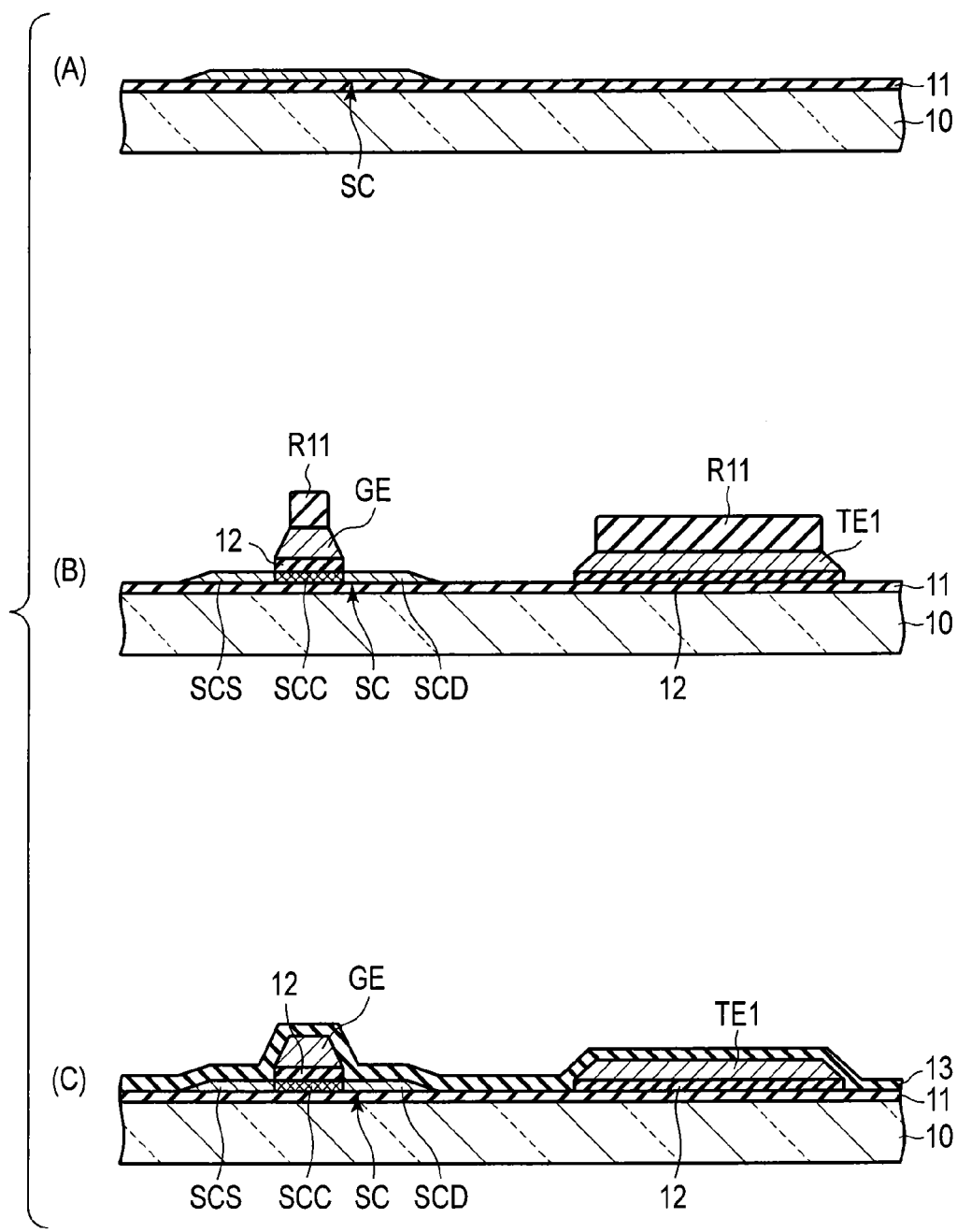
FIG. 3 is a view for describing a manufacturing method of the array substrate shown in FIG. 2.

To begin with, as shown in part (A) of FIG. 3, an undercoat layer 11 is formed on substantially the entire surface of an insulative substrate 10. Then, after a layer of an oxide semiconductor material is formed on the undercoat layer 11, the oxide semiconductor material is patterned in an island shape in accordance with a region where a thin-film transistor is to be formed. Thereby, an oxide semiconductor layer SC is formed.

Then, as shown in part (B) of FIG. 3, after a film of a gate insulation film material is formed, a film of a first conductive material is formed. Thereafter, a resist R11 is formed, which is patterned in an island shape in accordance with regions where a gate electrode GE and a first terminal electrode TE1 are formed. Then, using the resist R11 as a mask, the gate insulation film material and the first conductive material are patterned. Thereby, those portions of the gate insulation film material and first conductive material, which are exposed from the resist R11, are removed, a gate insulation film 12, a gate electrode GE and a first terminal electrode TE1 each having an island shape are formed, and a portion of the oxide semiconductor layer SC is exposed. Subsequently, the resistance of the exposed oxide semiconductor layer SC is decreased, for example, by being exposed to a reducing gas such as silane gas. Thereby, an oxide semiconductor layer SC is formed, which includes a source region SCS and a drain region SCD each having a low resistance on both sides of a channel region SCC located immediately under the gate electrode GE. Then, the resist R11 is removed.

Following the above, as shown in part (C) of FIG. 3, a first interlayer insulation film 13 is formed, which covers the oxide semiconductor layer SC, gate electrode GE and first terminal electrode TE1. The first interlayer insulation film 13 is formed, for example, by forming a film of a nonphotosensitive insulative material, such as silicon oxide, by using CVD (Chemical Vapor Deposition). The thickness of the first interlayer insulation film 13 is, for example, about 30 nm to 150 nm.

Figure 4:
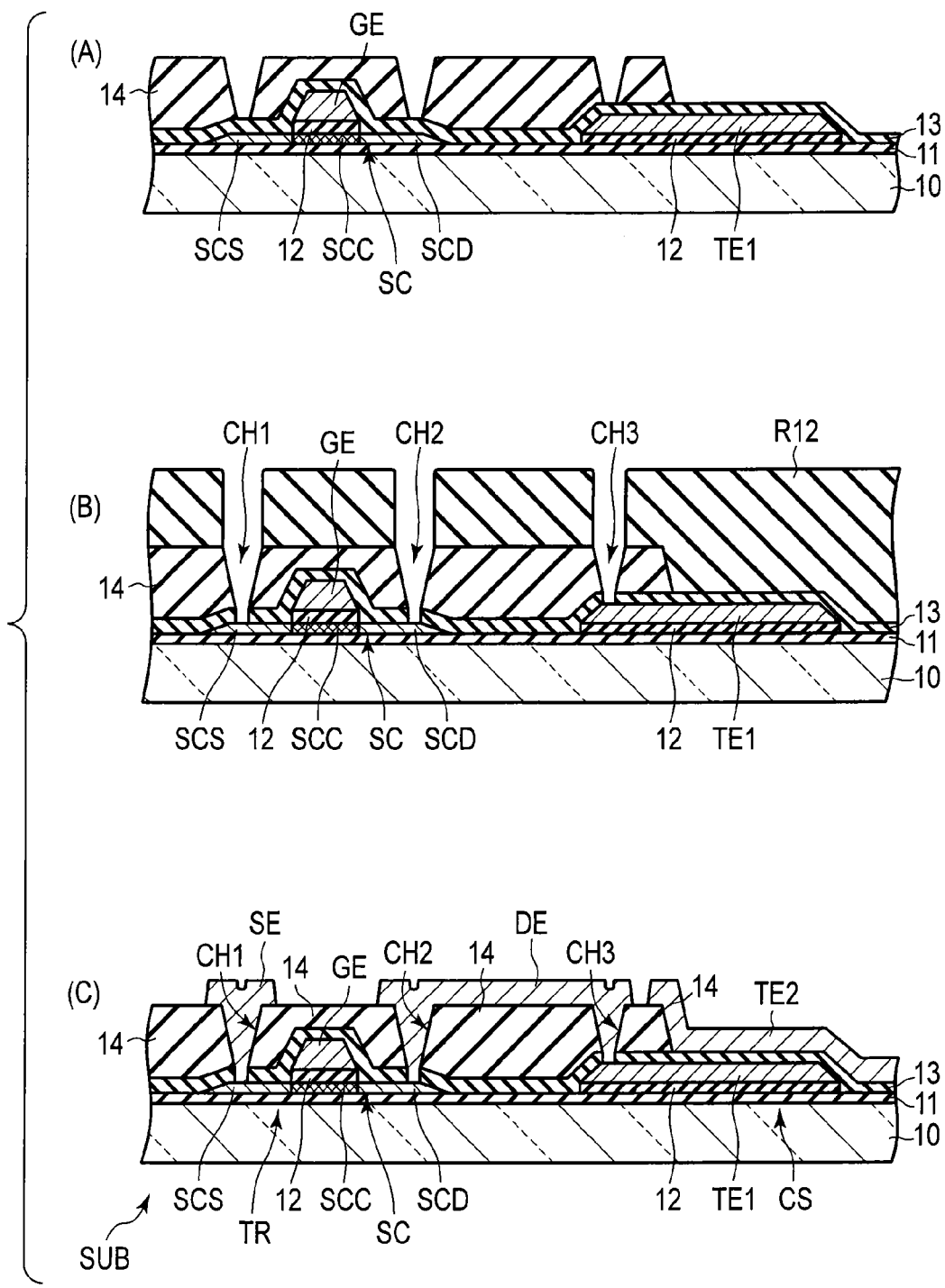
FIG. 4 is a view for describing the manufacturing method of the array substrate shown in FIG. 2.

Then, as shown in part (A) of FIG. 4, a second interlayer insulation film 14 is formed on the first interlayer insulation film 13. Through-holes, which penetrate to the first interlayer insulation film 13, are formed in those portions of the second interlayer insulation film 14, which are located above the source region SCS, drain region SCD and first terminal electrode TE1. In addition, in the region for forming the capacitor CS, that portion of the second interlayer insulation film 14, which is located above the first terminal electrode TE1, is removed. The second interlayer insulation film 14 is formed, for example, by coating a photosensitive insulative material, such as olefin resin, and then patterning the photosensitive insulative material by a photolithography process involving exposure and development treatment via a photomask. The thickness of the second interlayer insulation film 14 is, for example, about 0.5 µm to 3.0 µm.

Subsequently, as shown in part (B) of FIG. 4, a resist R12 is formed on the second interlayer insulation film 14, and also a resist R12 is formed on the first interlayer insulation film 13 in the region where the capacitor CS is to be formed. Those regions of the resist R12, which correspond to the through-holes in the second interlayer insulation film 14, have been removed at a time of patterning the resist R12. Then, using the resist R12 as a mask, portions of the first interlayer insulation film 13 are removed. Thereby, a contact hole CH1 penetrating to the source region SCS, a contact hole CH2 penetrating to the drain region SCD and a contact hole CH3 penetrating to the first terminal electrode TE1 are formed. Thereafter, the resist R12 is removed.

Then, as shown in part (C) of FIG. 4, a film of a second conductive material is formed. Thereafter, a resist is formed, which is patterned in an island shape in accordance with regions where a source electrode SE, a drain electrode DE and a second terminal electrode TE2 are to be formed, and the second conductive material is patterned. Thereby, the second conductive material exposed from the resist is removed, and the source electrode SE, drain electrode DE and second terminal electrode TE2 are formed. Then, the resist is removed. Further, a photosensitive insulative material, such as olefin resin, is coated, a fourth insulation film covering the thin-film transistor TR and capacitor CS is formed, and the surface thereof is planarized. A pixel electrode is formed, for example, on the fourth insulation film, and is put in contact with the drain electrode DE via a contact hole penetrating the fourth insulation film. Through the above series of fabrication steps, the array substrate or semiconductor device is manufactured.

According to the present embodiment, it is possible to form the thin-film transistor TR in which the oxide semiconductor layer SC is applied as the semiconductor layer, and the top gate structure is adopted. In addition, compared to a bottom gate structure, the channel length can be reduced and the parasitic capacitance can be decreased. Therefore, microfabrication of the thin-film transistor TR can be achieved and a higher capability can be realized.

In addition, the capacitor CS is configured such that the first terminal electrode TE1, which is the first conductive layer CD1 of the same material as the gate electrode GE, and the second terminal electrode TE2, which is the second conductive layer CD2 of the same material as the source electrode SE, are opposed to each other, and no use is made of a conductive layer which is formed of the same material as the oxide semiconductor layer SC. Thus, without depending on the formation process of the oxide semiconductor layer SC, the capacitor CS can be formed by the low-resistance first terminal electrode TE1 and second terminal electrode TE2. Specifically, the capacitor CS having an MIM structure (metal-insulator-metal) can be formed by a simple process. Even if an application voltage has varied, a variation in capacitance can be reduced, and a voltage margin can be increased. Thereby, the capacitor CS, which normally functions, can be constructed, and degradation in display capability and reliability can be suppressed.

Moreover, when the oxide semiconductor layer SC is applied as the semiconductor layer, it is not necessary to perform a step of crystallization by a laser anneal method which is required when low-temperature polysilicon is applied as a semiconductor layer, or a step of decreasing the resistance of a diffusion region by an ion implantation method, or a step of activation anneal which is required when the resistance of a diffusion region is lowered. Thus, the manufacturing cost can be reduced. In addition, when the oxide semiconductor layer SC is applied as the semiconductor layer, since a high-temperature process is needless, it is possible to realize fabrication of the thin-film transistor TR on a resin substrate, and to realize application to display devices called "sheet displays" or "flexible displays", commercialization of which has been expected in recent years.

Furthermore, the first interlayer insulation film 13, which covers the source region SCS and drain region SCD of the oxide semiconductor layer SC, is formed of the nonphotosensitive insulative material, in particular, the material including silicon oxide as a main component. It is thus possible to suppress the decrease in resistance of the channel region SCC due to diffusion of hydrogen into the oxide semiconductor layer SC from the first interlayer insulation film 13, and the high-capability thin-film transistor TR can be provided even if the channel length is decreased.

Besides, the second interlayer insulation film 14 covering the first interlayer insulation film 13 is formed of the photosensitive insulative material. Since the photosensitive insulative material can be patterned by a photolithography process, it is possible to prevent, in a process of forming the second interlayer insulation film 14, a decrease in thickness of the first interlayer insulation film 13 which is formed of the nonphotosensitive insulative material and becomes the underlayer of the second interlayer insulation film 14. It is thus possible to form the capacitor CS of the MIM structure in which the first interlayer insulation film 13 with a desired thickness is interposed. Therefore, a variance in capacitance among pixels can be suppressed.

In particular, in the structure in which the second interlayer insulation film 14 is formed of the photosensitive insulative material including at least olefin resin, the second interlayer insulation film 14 functions as a passivation film. Accordingly, there is no need to separately provide a passivation film, and the water-proof property can be enhanced. Since the gate electrode GE and oxide semiconductor layer SC of the thin-film transistor TR are hardly affected by moisture, the reliability of the thin-film transistor TR can be enhanced.

Next, other structure examples of the present embodiment will be described.

FIG. 5 is a cross-sectional view which schematically illustrates another structure example of the array substrate which is applicable to the display device shown in FIG. 1.

The structure example illustrated is different from the structure example in FIG. 2 with respect to the structure of the capacitor CS. The same structure as the structure example shown in FIG. 2 is denoted by like reference numerals, and a detailed description is omitted.

Specifically, a first terminal electrode TE1, which constitutes a capacitor CS, is located above the insulative substrate 10 and is formed on the undercoat layer 11. The first terminal electrode TE1 is formed of the same material as an oxide semiconductor layer SC. The resistance of the first terminal electrode TE1 is lowered to the same degree as a source region SCS and a drain region SCD. The first terminal electrode TE1, together with a gate electrode GE, source region SCS and drain region SCD, is covered with a first interlayer insulation film 13. In this structure example, too, since the first interlayer insulation film 13 is put in contact with not only the source region SCS and drain region SCD, but also the first terminal electrode TE1 formed of the oxide semiconductor, it is desirable that the first interlayer insulation film 13 be formed of a material including silicon oxide as a main component. The first terminal electrode TE1 and the second terminal electrode TE2 are opposed to each other via the first interlayer insulation film 13.

As described above, in the structure example shown in FIG. 2, the first terminal electrode TE1 of the capacitor CS is formed of the same material as the gate electrode GE. By contrast, in the structure example shown in FIG. 5, the first terminal electrode TE1 is formed of the same material as the oxide semiconductor layer SC. In the structure example shown in FIG. 5, since a gate insulation film (first insulation film) 12 is not provided above the first terminal electrode TE1, the resistance of the first terminal electrode TE1 is lowered at the same time as the formation of the source region SCS and drain region SCD of the oxide semiconductor layer SC, before the formation of the first interlayer insulation film 13. Accordingly, by using the first terminal electrode TE1 which is formed of the same material as the oxide semiconductor layer SC, the capacitor CS, whose capacitance does not depend on the application voltage, can be formed.

Next, an example of the manufacturing method of the array substrate SUB having the above-described structure will be described with reference to FIG. 6 and FIG. 7. An overlapping description with the above-described manufacturing method is simplified.

To begin with, as shown in part (A) of FIG. 6, an undercoat layer 11 is formed on substantially the entire surface of an insulative substrate 10. Then, after a film of an oxide semiconductor material is formed on the undercoat layer 11, the oxide semiconductor material is patterned in an island shape in accordance with a region where a thin-film transistor is to be formed and a region where a capacitor is to be formed. Thereby, an oxide semiconductor layer SC and a first terminal electrode TE1 are formed. At this time point, the oxide semiconductor layer SC and the first terminal electrode TE1 are films having a substantially equal high resistance.

Then, as shown in part (B) of FIG. 6, after a film of a gate insulation film material is formed, a film of a first conductive material is formed. Thereafter, a resist R21 is formed, which is patterned in an island shape in accordance with a region where a gate electrode GE is formed. Then, using the resist R21 as a mask, the gate insulation film material and the first conductive material are patterned. Thereby, those portions of the gate insulation film material and first conductive material, which are exposed from the resist R21, are removed, a gate insulation film 12 and a gate electrode GE each having an island shape are formed, and a portion of the oxide semiconductor layer SC and the entirety of the first terminal electrode TE1 are exposed. Subsequently, the resistance of the exposed oxide semiconductor layer SC and first terminal electrode TE1 is decreased, for example, by being exposed to a reducing gas. Thereby, an oxide semiconductor layer SC is formed, which includes a source region SCS and a drain region SCD each having a low resistance on both sides of a channel region SCC located immediately under the gate electrode GE. In addition, the first terminal electrode TE1, which is spaced apart from the oxide semiconductor layer SC, is formed. Since the oxide semiconductor layer SC and first terminal electrode TE1 are subjected to the resistance-decreasing process under substantially the same condition, the resistance values of the oxide semiconductor layer SC and first terminal electrode TE1 are substantially equal. Then, the resist R21 is removed.

Following the above, as shown in part (C) of FIG. 6, a first interlayer insulation film 13, which covers the oxide semiconductor layer SC, gate electrode GE and first terminal electrode TE1, is formed.

Figure 7:
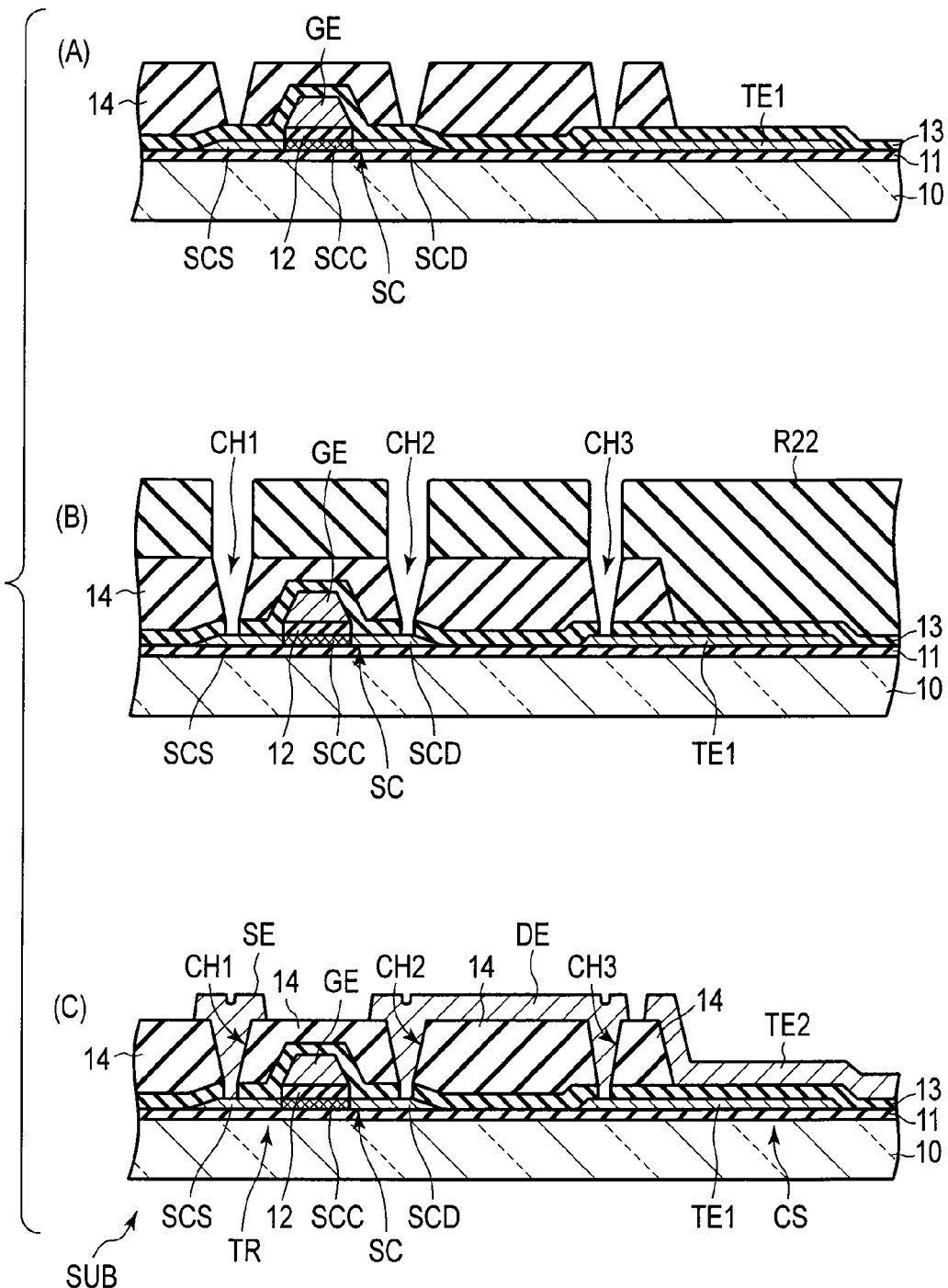
FIG. 7 is a view for describing the manufacturing method of the array substrate shown in FIG. 5.

Then, as shown in part (A) of FIG. 7, a second interlayer insulation film 14 is formed on the first interlayer insulation film 13. Through-holes, which penetrate to the first interlayer insulation film 13, are formed in those portions of the second interlayer insulation film 14, which are located above the source region SCS, drain region SCD and first terminal electrode TE1. In addition, in the region for forming the capacitor CS, that portion of the second interlayer insulation film 14, which is located above the first terminal electrode TE1, is removed.

Subsequently, as shown in part (B) of FIG. 7, a resist R22 is formed on the second interlayer insulation film 14, and also a resist R22 is formed on the first interlayer insulation film 13 in the region where the capacitor CS is to be formed. Then, using the resist R22 as a mask, portions of the first interlayer insulation film 13 are removed. Thereby, a contact hole CH1 penetrating to the source region SCS, a contact hole CH2 penetrating to the drain region SCD and a contact hole CH3 penetrating to the first terminal electrode TE1 are formed. Thereafter, the resist R22 is removed.

Then, as shown in part (C) of FIG. 7, a film of a second conductive material is formed. Thereafter, a resist is formed, which is patterned in an island shape in accordance with regions where a source electrode SE, a drain electrode DE and a second terminal electrode TE2 are to be formed, and the second conductive material is patterned. Thereby, the source electrode SE, drain electrode DE and second terminal electrode TE2 are formed. These source electrode SE, drain electrode DE and second terminal electrode TE2 are formed in the same layer.

Alternatively, the source electrode SE and drain electrode DE may be formed in a layer which is different from a layer of the second terminal electrode TE2. For example, the source electrode SE and drain electrode DE may be disposed on another interlayer insulation film which is disposed on the second terminal electrode TE2. In this case, the source electrode SE and drain electrode DE are put in contact with the oxide semiconductor layer SC and the first terminal electrode TE1, respectively, via contact holes penetrating the first interlayer insulation film 13, the second interlayer insulation film 14 and the another interlayer insulation film. The second conductive layer CD2 can be formed of the same material as the above-described first conductive layer CD1.

By the above-described fabrication steps, in the capacitor CS, a capacitance can be produced via the first interlayer insulation film 13.

Through the above series of fabrication steps, the array substrate or semiconductor device is manufactured.

In this structure example, the same advantageous effects as in the above-described structure example can be obtained. Furthermore, although the first terminal electrode TE1 is formed of the same material as the oxide semiconductor layer SC, the resistance of the first terminal electrode TE1 can be decreased at the same time in the step of decreasing the resistance of the source region SCS and drain region SCD of the oxide semiconductor layer SC. Thus, there is no need to separately provide a special process, and, like the above-described structure example, the capacitor CS, which has a wide voltage margin and normally functions, can be constructed.

As has been described above, according to the present embodiment, a semiconductor device, which can enhance the capability of a thin-film transistor, can be provided.

In the above-described embodiment, the liquid crystal display device has been described as an example of the display device. However, the present embodiment is applicable to other display devices such as an organic electroluminescence display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    an insulative substrate;
    an oxide semiconductor layer located above the insulative substrate and including a channel region, and a source region and a drain region which are located on both sides of the channel region;
    a first insulation film covering the channel region and exposing the source region and the drain region;
    a first conductive layer including a gate electrode located on the first insulation film, and a first terminal electrode located above the insulative substrate and spaced apart from the gate electrode;
    a second insulation film covering the first conductive layer, the source region and the drain region and formed of a nonphotosensitive insulative material which includes silicon oxide as a main component;
    a second conductive layer including a source electrode which is put in contact with the source region, a drain electrode which is put in contact with the drain region, and a second terminal electrode which is opposed to the first terminal electrode via the second insulation film; and
    a third insulation film interposed between the second insulation film, and the source electrode and the drain electrode and formed of a photosensitive insulative material which includes at least olefin resin,
    wherein a part of the third insulation film between the first terminal electrode and the second terminal electrode is removed.

2. The semiconductor device of claim 1, wherein the oxide semiconductor layer is formed of an oxide including at least one of indium (In), gallium (Ga) and zinc (Zn).

3. A semiconductor device comprising:
    an insulative substrate;
    an oxide semiconductor layer located above the insulative substrate and including a channel region, and a source region and a drain region which are located on both sides of the channel region;
    a first terminal electrode located above the insulative substrate and formed of the same material as the oxide semiconductor layer;
    a first insulation film covering the channel region and exposing the source region and the drain region;
    a first conductive layer including a gate electrode located on the first insulation film;
    a second insulation film covering the first conductive layer, the first terminal electrode, the source region and the drain region and formed of a nonphotosensitive insulative material which includes silicon oxide as a main component;
    a second conductive layer including a source electrode which is put in contact with the source region, a drain electrode which is put in contact with the drain region, and a second terminal electrode which is opposed to the first terminal electrode via the second insulation film; and
    a third insulation film interposed between the second insulation film, and the source electrode and the drain electrode and formed of a photosensitive insulative material which includes at least olefin resin,
    wherein a part of the third insulation film between the first terminal electrode and the second terminal electrode is removed.

4. The semiconductor device of claim 3, wherein the oxide semiconductor layer is formed of an oxide including at least one of indium (In), gallium (Ga) and zinc (Zn).

* * * * *